(12) United States Patent
Sekine et al.

(10) Patent No.: US 9,685,394 B2
(45) Date of Patent: Jun. 20, 2017

(54) ELECTRONIC DEVICE AND MANUFACTURING METHOD THEREFOR

(75) Inventors: Shigenobu Sekine, Tokyo (JP); Yurina Sekine, Tokyo (JP); Yoshiharu Kuwana, Tokyo (JP)

(73) Assignee: NAPRA CO., LTD., Tokyo (JP)

( * ) Notice: Subject to any disclaimer, the term of this patent is extended or adjusted under 35 U.S.C. 154(b) by 0 days.

(21) Appl. No.: 13/106,933

(22) Filed: May 13, 2011

(65) Prior Publication Data

US 2011/0284912 A1  Nov. 24, 2011

(30) Foreign Application Priority Data

May 21, 2010 (JP) ................................ 2010-117008
Mar. 15, 2011 (JP) ................................ 2011-056556

(51) Int. Cl.
*H01L 33/62* (2010.01)
*H01L 21/28* (2006.01)
(Continued)

(52) U.S. Cl.
CPC ...... *H01L 23/481* (2013.01); *H01L 21/76898* (2013.01); *H01L 2224/13* (2013.01);
(Continued)

(58) Field of Classification Search
CPC ........... H01L 21/76898; H01L 2224/13; H01L 2224/16146; H01L 2224/81; H01L 23/481; H01L 2924/09701
(Continued)

(56) References Cited

U.S. PATENT DOCUMENTS 6,001,445 A * 12/1999 Itoh ........................ C03C 3/076
428/64.1
7,436,069 B2   10/2008 Matsui
(Continued)

FOREIGN PATENT DOCUMENTS

EP  0 974 817 A1  1/2000
EP  1 465 246 A2  10/2004
(Continued)

OTHER PUBLICATIONS

Chong, et al., "Dielectric Constant and Optical Reflectance of Ceramic Filler-Added BaO—ZnO—B2O3—P2O5 Glass Composites", International Journal of Applied Ceramic Technology, 2008.*
(Continued)

*Primary Examiner* — Ori Nadav
*Assistant Examiner* — Ernest Allen, III
(74) *Attorney, Agent, or Firm* — Westerman, Hattori, Daniels & Adrian, LLP

(57) ABSTRACT

An electronic device includes a semiconductor substrate, an insulating material-filled layer and a vertical conductor. The semiconductor substrate has a vertical hole extending in a thickness direction thereof. The insulating material-filled layer is a ring-shaped layer filled in the vertical hole for covering an inner periphery thereof and includes an organic insulating material or an inorganic insulating material mainly of a glass and a nanocomposite ceramic. The nanocomposite ceramic has a specific resistance of greater than $10^{14}$ $\Omega$·cm at room temperature and a relative permittivity of 4 to 9. The vertical conductor is a solidified metal body filled in an area surrounded by the insulating material-filled layer.

6 Claims, 8 Drawing Sheets

(51) Int. Cl.
*H01L 23/48* (2006.01)
*H01L 21/768* (2006.01)

(52) U.S. Cl.
CPC .... *H01L 2224/16146* (2013.01); *H01L 2224/81* (2013.01); *H01L 2924/09701* (2013.01); *H01L 2924/13091* (2013.01); *H01L 2924/1461* (2013.01)

(58) Field of Classification Search
USPC ............ 257/99, E21.158, E33.066; 438/667
See application file for complete search history.

(56) References Cited

U.S. PATENT DOCUMENTS

| | | | |
|---|---|---|---|
| RE40,947 E * | 10/2009 | Asai | H05K 3/0094 174/1 |
| 2002/0017710 A1 * | 2/2002 | Kurashima | H01L 21/76898 257/686 |
| 2004/0043615 A1 | 3/2004 | Yamamoto et al. | |
| 2004/0222433 A1 * | 11/2004 | Mazzochette et al. | 257/99 |
| 2006/0118965 A1 | 6/2006 | Matsui | |
| 2007/0045779 A1 | 3/2007 | Hiatt | |
| 2007/0246253 A1 | 10/2007 | Yakabe et al. | |
| 2008/0017404 A1 * | 1/2008 | Whittaker et al. | 174/255 |
| 2008/0029850 A1 | 2/2008 | Hedler et al. | |
| 2008/0237781 A1 | 10/2008 | Uchiyama | |
| 2009/0084588 A1 * | 4/2009 | Sekine | H01L 21/76898 174/257 |
| 2009/0224278 A1 * | 9/2009 | Nagai | 257/99 |
| 2010/0301485 A1 | 12/2010 | Sekine et al. | |

FOREIGN PATENT DOCUMENTS

| | | |
|---|---|---|
| JP | 05-259299 A | 10/1993 |
| JP | 06-097298 A | 4/1994 |
| JP | 10-215044 A | 8/1998 |
| JP | 2000-311982 A | 11/2000 |
| JP | 2004-095849 A | 3/2004 |
| JP | 2005-501413 A | 1/2005 |
| JP | 2006-024653 A | 1/2006 |
| JP | 2006-049557 A | 2/2006 |
| JP | 2006-165025 A | 6/2006 |
| JP | 2008-047895 A | 2/2008 |
| JP | 2008-251964 A | 10/2008 |
| JP | 4278007 B1 | 6/2009 |
| JP | 2009-277927 A | 11/2009 |
| JP | 2010-205941 A | 9/2010 |
| JP | 2010-283034 A | 12/2010 |
| WO | 03/019651 A2 | 3/2003 |
| WO | 2010/100845 A1 | 9/2010 |

OTHER PUBLICATIONS

Chong et al. "Dielectric Constant and Optical Reflectance of Ceramic Filler-Added BaO—ZnO—B2O3—P2O5 Glass Composites", International Journal of Applied Ceramic Technology 6, vol. 2 (Mar. 2009), pp. 295-301.*
Japanese Office Action dated Nov. 24, 2011, issued in corresponding Japanese Patent Application No. 2011-056556.
Japanese Office Action dated Feb. 15, 2012, issued in corresponding Japanese Patent Application No. 2011-056556.
Japanese Office Action dated Aug. 31, 2011, issued in corresponding Japanese Patent Application No. 2011-056556.
Extended European Search Report dated Mar. 20, 2014, issued in European Patent Application No. 11250541.7, (14 pages).

* cited by examiner

ELECTRONIC DEVICE AND MANUFACTURING METHOD THEREFOR

BACKGROUND OF THE INVENTION

1. Field of the Invention

The present invention relates to an electronic device and a manufacturing method therefor.

2. Description of the Related Art

Recently there has been proposed a TSV (through-silicon-via) technology of providing a semiconductor substrate such as a silicon substrate with a large number of through-electrodes. With the TSV technology, many functions can be packed into a small footprint, and important electrical pathways between elements can also be dramatically shortened to facilitate increasing processing speed.

When using the TSV technology, the through-electrodes have to be electrically insulated from the silicon substrate. As means for electrical insulation, Japanese Unexamined Patent Application Publication No. 2008-251964 discloses a technology of forming a ring-shaped isolation groove passing through a silicon substrate in such a manner as to surround a through-electrode passing through the silicon substrate in a spaced apart relationship, forming a silicon film directly on the bottom face and the side faces of the isolation groove, then forming an insulation film on the silicon film in such a manner as to fill up a gap left in the isolation groove, and thermally oxidizing each face of the silicon film in contact with the inner or outer peripheral side face of the isolation groove into a thermally-oxidized silicon film.

However, since the distance between the through-electrodes has to be large in the structure where the ring-shaped, insulating isolation groove is provided to surround the through-electrode passing through the silicon substrate in a spaced apart relationship, there is a limit on high-density distribution of the through-electrodes and further increase in performance and functionality of the electronic device.

Moreover, since it requires the steps of forming a silicon film directly on the bottom face and the side faces of the isolation groove, forming an insulation film on the silicon film in such a manner as to fill up a gap left in the isolation groove after formation of the silicon film, and then thermally oxidizing the surface of the silicon film, the process inevitably becomes complicated and time-consuming. When replacing the conventional planar arrangement with the TSV technology, cost performance is important from the viewpoint of industrial mass production, but the above related art cannot meet this need sufficiently.

Furthermore, since the isolation groove has to be filled with a film in the above related art, the groove width of the isolation groove has to be set at an extremely small value, e.g., about 2 µm, so that considering the ordinary thickness of a wafer, the aspect ratio of the isolation groove becomes as large as 100 to 200. This makes it difficult to form a silicon film in the isolation groove.

Since electronic devices, to which the TSV technology is to be applied, need higher frequency from the viewpoint of increasing the processing speed and the transfer rate, it is required to suppress the leakage of high-frequency current passing through the through-electrode as much as possible, i.e., to improve the high-frequency characteristics.

The TSV technology is applicable to a wide variety of electronic devices having the semiconductor substrate as a functional element, such as a sensor module, an optoelectronic module, a unipolar transistor, a MOS FET, a CMOS FET, a memory cell, integrated circuits (IC) thereof, various scales of LSIs, a light-emitting diode, and a solar cell, but the above-described problems occur in any case. It should be noted that related art documents also include Japanese Unexamined Patent Application Publication Nos. 2000-311982, 2004-095849, 2009-277927, 2006-024653, 2006-049557, 10-215044 and 2008-47895.

SUMMARY OF THE INVENTION

It is an object of the present invention to provide an electronic device having high performance, high functionality and excellent high-frequency characteristics and a manufacturing method therefor.

It is another object of the present invention to provide an electronic device whose insulation structure is effective in reducing cost and a manufacturing method therefor.

In order to achieve the above object, an electronic device according to the present invention comprises a semiconductor substrate, an insulating material-filled layer and a vertical conductor. The semiconductor substrate has a vertical hole extending in a thickness direction thereof. The insulating material-filled layer is a ring-shaped layer filled in the vertical hole for covering an inner periphery thereof and includes an organic insulating material or an inorganic insulating material mainly of a glass and a nanocomposite ceramic. The nanocomposite ceramic has a specific resistance of greater than $10^{14}$ Ω·cm at room temperature and a relative permittivity of 4 to 9. The vertical conductor is a solidified metal body filled in an area surrounded by the insulating material-filled layer.

In the electronic device according to the present invention, as described above, the semiconductor substrate has a vertical hole extending in a thickness direction thereof, the insulating material-filled layer is a ring-shaped layer filled in the vertical hole for covering an inner periphery thereof, and the vertical conductor is filled in an area surrounded by the insulating material-filled layer, so that the vertical conductor such as a through-electrode can be electrically insulated from another adjacent vertical conductor by the ring-shaped insulating material-filled layer.

Moreover, since the insulating material-filled layer comprises an inorganic insulating material mainly of a glass or an organic insulating material filled in the vertical hole and the vertical conductor is a conductor filled in an area surrounded by the insulating material-filled layer, both the vertical conductor and the insulating material-filled layer can be disposed within the vertical hole unlike the conventional structure where the ring-shaped, insulating isolation groove is provided to surround the through-electrode in a spaced apart relationship. This reduces the area occupied by the vertical conductors and the insulating material-filled layers, thereby reducing the pitch distance between adjacent vertical conductors. As a result, the vertical conductors can be distributed more densely to realize a high-performance, high-functionality electronic device.

Since the insulating material-filled layer is filled in the vertical hole and the vertical conductor is a conductor filled in an area surrounded by the insulating material-filled layer, they both can be obtained by a simple and low-cost process, i.e., a process of filling them into the vertical hole. As used herein, the term "fill" means "pour as much of a substance into as can be conveniently held" and should be distinguished from a film deposition process such as sputtering.

The insulating material-filled layer contains an organic insulating material or an inorganic insulating material mainly of a glass. Since a variety of materials having different relative permittivities and specific resistances have been known as such insulating materials, the relative permittivity and specific resistance can be controlled by selecting the material, thereby reducing the signal leakage at high frequencies to improve the signal transfer characteristics.

Here, the organic insulating material can easily be turned into a paste. Liquid glass, i.e., glass in the form of paste also has been known for the inorganic insulating material. Accordingly, a low-cost electronic device can be obtained by a simple and low-cost process, i.e., a process of filling such a paste material into the vertical hole.

In addition to the organic insulating material or the inorganic insulating material mainly of a glass, the insulating material-filled layer also contains a nanocomposite ceramic as a component. The nanocomposite ceramic has a specific resistance of greater than $10^{14}$ Ω·cm at room temperature and a relative permittivity of 4 to 9. With this, the relative permittivity and specific resistance of the whole insulating material-filled layer can be controlled, reducing the signal leakage at high frequencies to improve the signal transfer characteristics.

The electronic device according to the present invention may further include an electromagnetic shielding layer. The electromagnetic shielding layer is embedded in the insulating material-filled layer to surround the vertical conductor. In a semiconductor substrate provided with a circuit element being an active element such as a semiconductor circuit or a passive element such as an antenna, the above electromagnetic shielding layer can avoid characteristic change of the circuit element due to electromagnetic field generated by high-frequency current passing through the vertical conductor (through-electrode).

The electronic device according to the present invention may be embodied as an interposer or a semiconductor wafer or device provided with a semiconductor element. A typical example of such an electronic device is a three-dimensional system-in-package (3D-SiP). Otherwise it may be a light-emitting diode, a solar cell or a device using the same.

Japanese Unexamined Patent Application Publication Nos. 2000-311982, 2004-095849, 2009-277927, 2006-024653, 2006-049557, 10-215044 and 2008-47895, which have been mentioned above as related art documents, all differ from the present invention in the following points. First, a conductive layer disclosed in Japanese Unexamined Patent Application Publication No. 2000-311982 is formed by filling a fluid conductive resin or the like into a second through-hole and therefore is not a solidified metal body. Accordingly, it is free from the problem of heat resistance, which has to be taken into consideration in the case of the solidified metal body. Moreover, it does not suggest that an intermediate insulating layer contains a nanocomposite ceramic for improving high-frequency characteristics in an inorganic insulating film mainly of a glass or an organic insulating film.

In Japanese Unexamined Patent Application Publication No. 2004-095849, a first silicon oxide film is obtained by thermally oxidizing a silicon substrate. In Japanese Unexamined Patent Application Publication No. 2009-277927, an insulating film for a semiconductor substrate is disposed at its both sides and at a boundary between a through-electrode and the substrate. It merely discloses that the insulating film is a film of $SiO_2$ or $Al_2O_3$.

In Japanese Unexamined Patent Application Publication No. 2006-024653, a conductive layer (second conductive layer) corresponding to the vertical conductor is a plated layer, while an insulating layer is a silicon oxide film. In Japanese Unexamined Patent Application Publication No. 2006-049557, a first conductor is formed by electroplating, while first and second insulating materials are represented by $SiO_2$ alone.

In Japanese Unexamined Patent Application Publication No. 10-215044, a metallized wiring conductor is a sintered metal body of, for example, tungsten, molybdenum, copper, silver or the like and therefore is not a solidified metal body. A ceramic filling material disposed within a tubular metallized conductor comprises a ceramic material such as an aluminum oxide sintered body, an aluminum nitride sintered body, a mullite sintered body, a silicon carbide sintered body, a glass ceramic sintered body or the like. Japanese Unexamined Patent Application Publication No. 2008-47895 discloses a protective layer, but this protective layer is made of silicon oxide ($SiO_2$).

As has been described above, none of Japanese Unexamined Patent Application Publication Nos. 2000-311982, 2004-095849, 2009-277927, 2006-024653, 2006-049557, 10-215044 and 2008-47895 discloses including an inorganic insulating film mainly of a glass or an organic insulating film and a nanocomposite ceramic for improving high-frequency characteristics.

The present invention will be more fully understood from the detailed description given hereinbelow and the accompanying drawings which are given by way of illustration only, and thus not to be considered as limiting the present invention.

DESCRIPTION OF THE PREFERRED EMBODIMENTS

Figure 1:
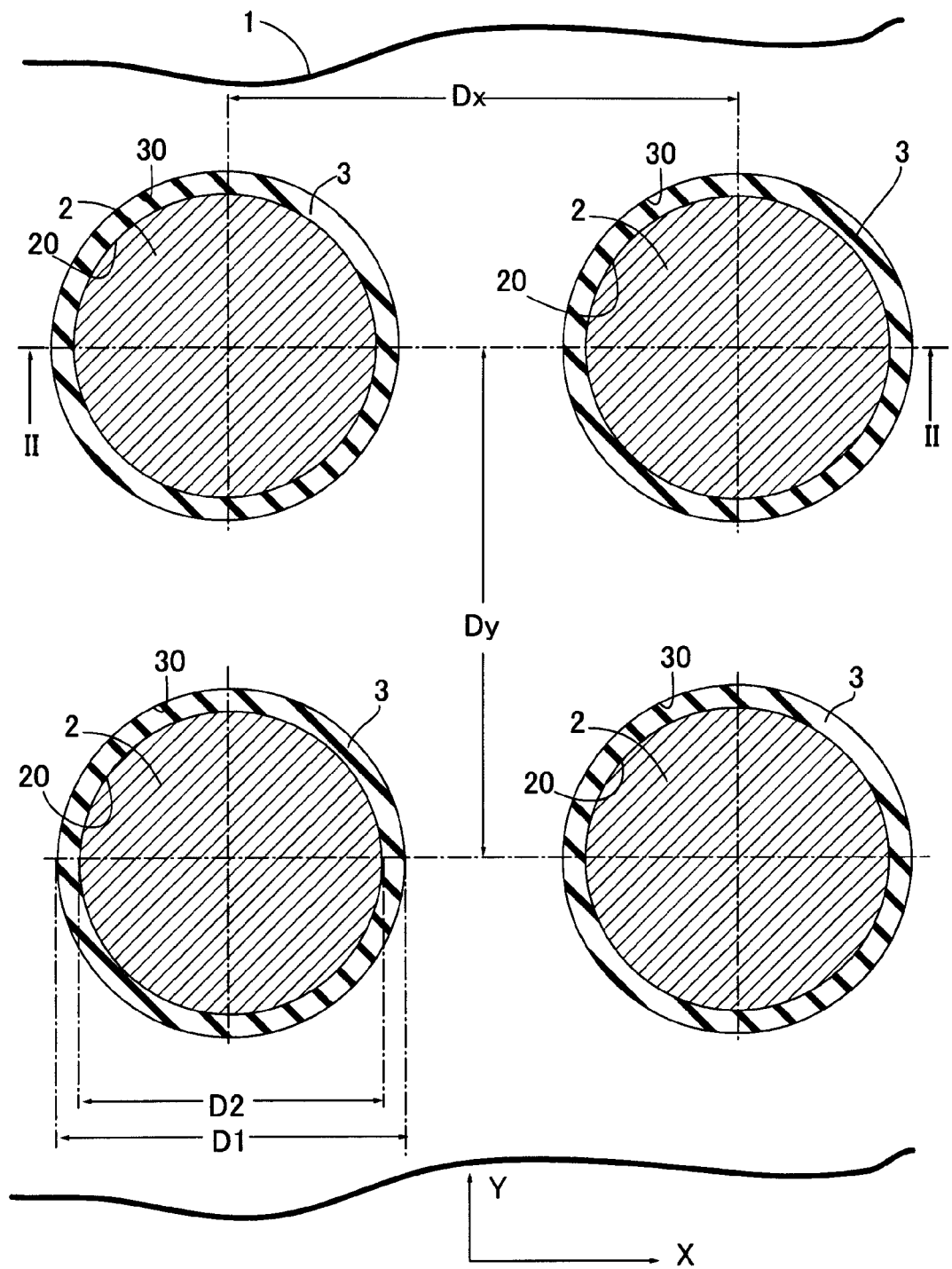
FIG. 1 is a plan view showing a part of an electronic device according to the present invention.
Figure 2:
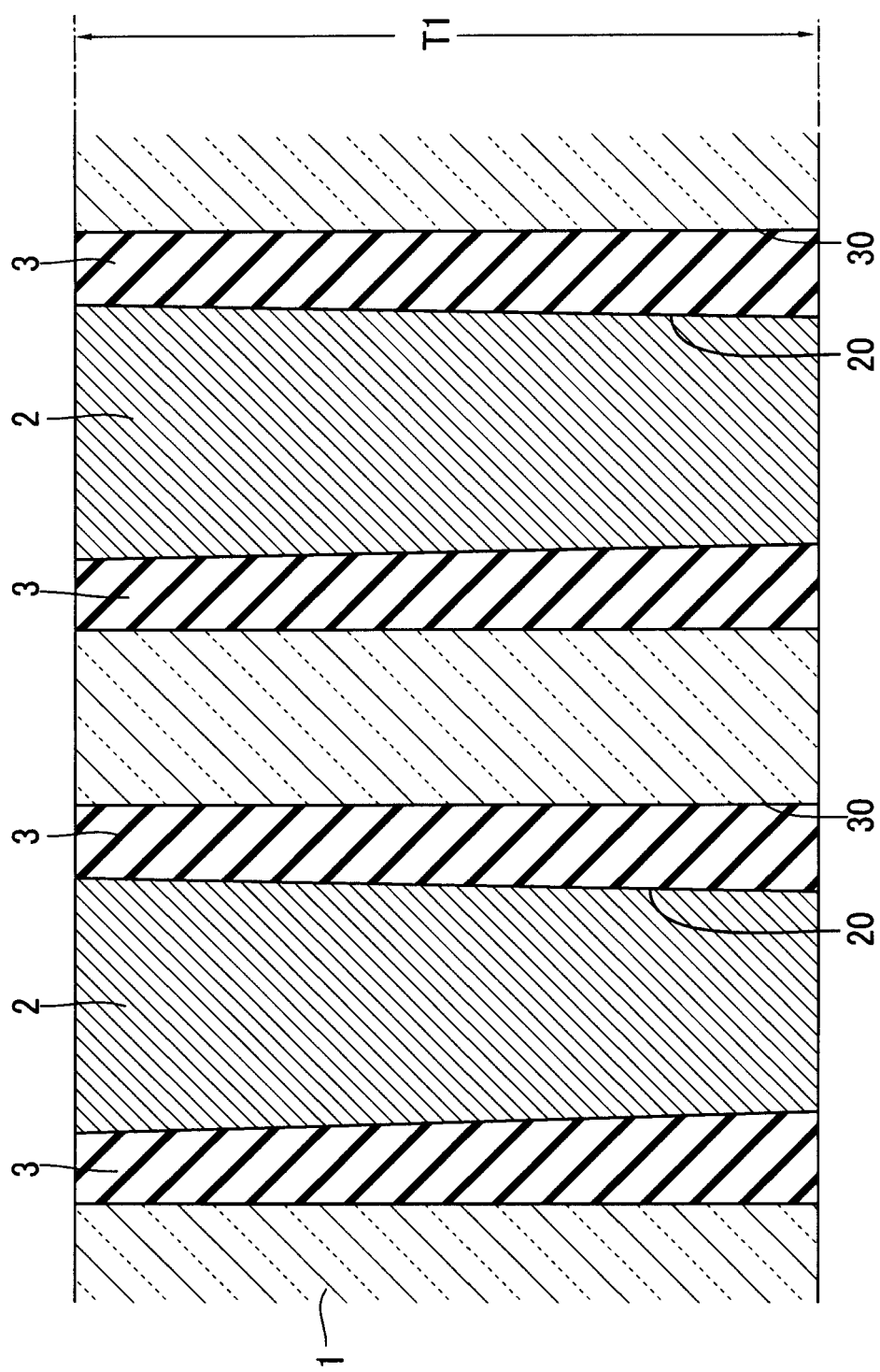
FIG. 2 is a sectional view taken along line II-II in FIG. 1.

Referring to FIGS. 1 and 2, an interposer is illustrated as one embodiment of an electronic device according to the present invention. The interposer includes a semiconductor substrate 1, a vertical conductor 2 and an insulating material-filled layer 3. The semiconductor substrate 1 is, for example, a silicon substrate having a thickness T1 and in the form of a wafer or a chip cut out from the wafer. The thickness T1 may be, but not limited to, about 50 to 700 μm.

The semiconductor substrate 1 has a vertical hole 30 extending in a thickness direction thereof. The vertical holes 30 shown in the present embodiment pass through the semiconductor substrate 1 in the thickness direction with an inside diameter D1 and are arranged in rows, for example, in the form of matrix, as seen in an X-Y plane taken along the substrate surface, at a given arrangement pitch Dx, Dy in X, Y directions. However, the arrangement pitch Dx, Dy is not required to be constant, and the opening may take any shape such as a circular shape or a square shape.

The insulating material-filled layer 3 is a ring-shaped layer having an inorganic insulating material or an organic insulating material filled in the vertical hole 30. Thus, a cylindrical area 20 is formed in the insulating material-filled layer 3. The vertical conductor 2 is filled in the cylindrical area 20 surrounded by the insulating material-filled layer 3. The vertical conductor 2 shown in the present embodiment is a through-electrode passing through the semiconductor substrate 1. For example, the vertical conductor 2 is dimensioned such that the arrangement pitch Dx, Dy is in the range of 4 to 100 μm and a maximum diameter D2 is in the range of 0.5 to 25 μm.

As described above, the semiconductor substrate 1 has the vertical hole 30 extending in the thickness direction thereof, the insulating material-filled layer 3 is the ring-shaped layer covering the inner periphery of the vertical hole 30, and the vertical conductor 2 is filled in the area 20 surrounded by the insulating material-filled layer 3, so that the vertical conductor 2 such as a through-electrode can be electrically insulated from another adjacent vertical conductor 2 by the ring-shaped insulating material-filled layer 3.

Moreover, since the insulating material-filled layer 3 comprises an insulating material filled in the vertical hole and the vertical conductor 2 is a conductor filled in the area 20 surrounded by the insulating material-filled layer 3, both the vertical conductor 2 and the insulating material-filled layer 3 can be disposed within the vertical hole 30 unlike the conventional structure where the ring-shaped, insulating isolation groove is provided to surround the through-electrode in a spaced apart relationship. This reduces the area occupied by the vertical conductors 2 and the insulating material-filled layers 3, thereby reducing the pitch distance between adjacent vertical conductors. As a result, the vertical conductors 2 can be distributed more densely to realize a high-performance, high-functionality electronic device.

For the insulating material-filled layer 3, furthermore, a material having a low relative permittivity and a high specific resistance can be selected among inorganic insulating materials or organic insulating materials. Therefore, the relative permittivity and specific resistance of the whole insulating material-filled layer 3 can be controlled by selecting the material, thereby reducing the signal leakage at high frequencies to improve the signal transfer characteristics.

The insulating material-filled layer 3 can be formed by filling a paste of an organic insulating material or a liquid glass, i.e., glass paste, into the vertical hole 30 and hardening it under pressure. That is, the insulating material-filled layer 3 can be formed by a simple and low-cost process of filling a paste material into the vertical hole 30 and hardening it.

Moreover, since the insulating material-filled layer 3 is a filled layer, there is no reason to narrow the groove width of the vertical hole 30 unlike the conventional technique requiring a film deposition process. This facilitates the process of forming the insulating material-filled layer 3.

Examples of the organic insulating material for forming the insulating material-filled layer 3 include an epoxy resin, a polyimide resin, a novolak resin, a liquid crystal polymer and an ultraviolet curable resin.

A typical example of the inorganic insulating material for forming the insulating material-filled layer 3 is made mainly of a glass. Various types of glass materials can be used. For example, the glass material may contain at least one of $SiO_2$, $PbO$, $B_2O_3$, $ZnO$, $MgO$, $Al_2O_3$, $Na_2CO_3$, $CaCO_3$, $Na_2O$, $CaO$ and $K_2O$. Among these glass materials, a material having a low relative permittivity and a high specific resistance can be selected for use. This makes it possible to control the relative permittivity and specific resistance of the whole insulating material-filled layer 3, thereby reducing the signal leakage at high frequencies to improve the signal transfer characteristics.

In addition to the glass component, the insulating material-filled layer 3 also contains a nanocomposite ceramic. The nanocomposite ceramic is intended to improve the high frequency characteristics, wherein the relative permittivity and specific resistance of the whole insulating material-filled layer 3 can be controlled by selecting its relative permittivity and specific resistance, thereby reducing the signal leakage at high frequencies of the order of GHz to improve the signal transfer characteristics. Examples of such a ceramic material include alumina ($Al_2O_3$), mullite ($3Al_2O_3 \cdot 2SiO_2$), cordierite ($2MgO \cdot 2Al_2O_3 \cdot 5SiO_2$), steatite ($MgO \cdot SiO_2$), forsterite ($2MgO \cdot SiO_2$), silicon nitride ($Si_3N_4$) and aluminum nitride (AlN) having a specific resistance of greater than $10^{14}$ Ω·cm at room temperature and a relative permittivity of 4 to 9.

The vertical conductor 2 may be formed by applying a known technology such as a plating process, a molten metal filling process, or a conductive paste filling process. Materials for forming the vertical conductor 2 may be different for different formation processes. In the case of the plating process, a Cu plating film is widely used; in the case of the molten metal filling process, it is possible to use a metal component containing at least one metal element selected from the group consisting of Ag, Cu, Au, Pt, Pd, Ir, Al, Ni, Sn, In, Bi and Zn.

Preferably, the above-mentioned metal components and the resulting vertical conductor 2 also have a nanocomposite structure.

The advantage of using the above-mentioned nanocomposite metal components resides in that the nanocomposite structure can reduce stress that will be generated in the vertical conductor 2 because of its capability of facilitating formation of equiaxed crystal.

It should be noted that the nanocomposite structure refers to a structure where nanoparticles are dispersed in crystal grains of one of a plurality of elements (intragranular nanocomposite crystal structure) or a structure where nanoparticles are dispersed in grain boundaries (interglanular nanocomposite crystal structure). When using a single element, it refers to a structure where a crystalline structure is mixed with an amorphous structure, wherein the nanocomposite structure becomes more prominent with an increase in crystallization rate.

Figure 3:
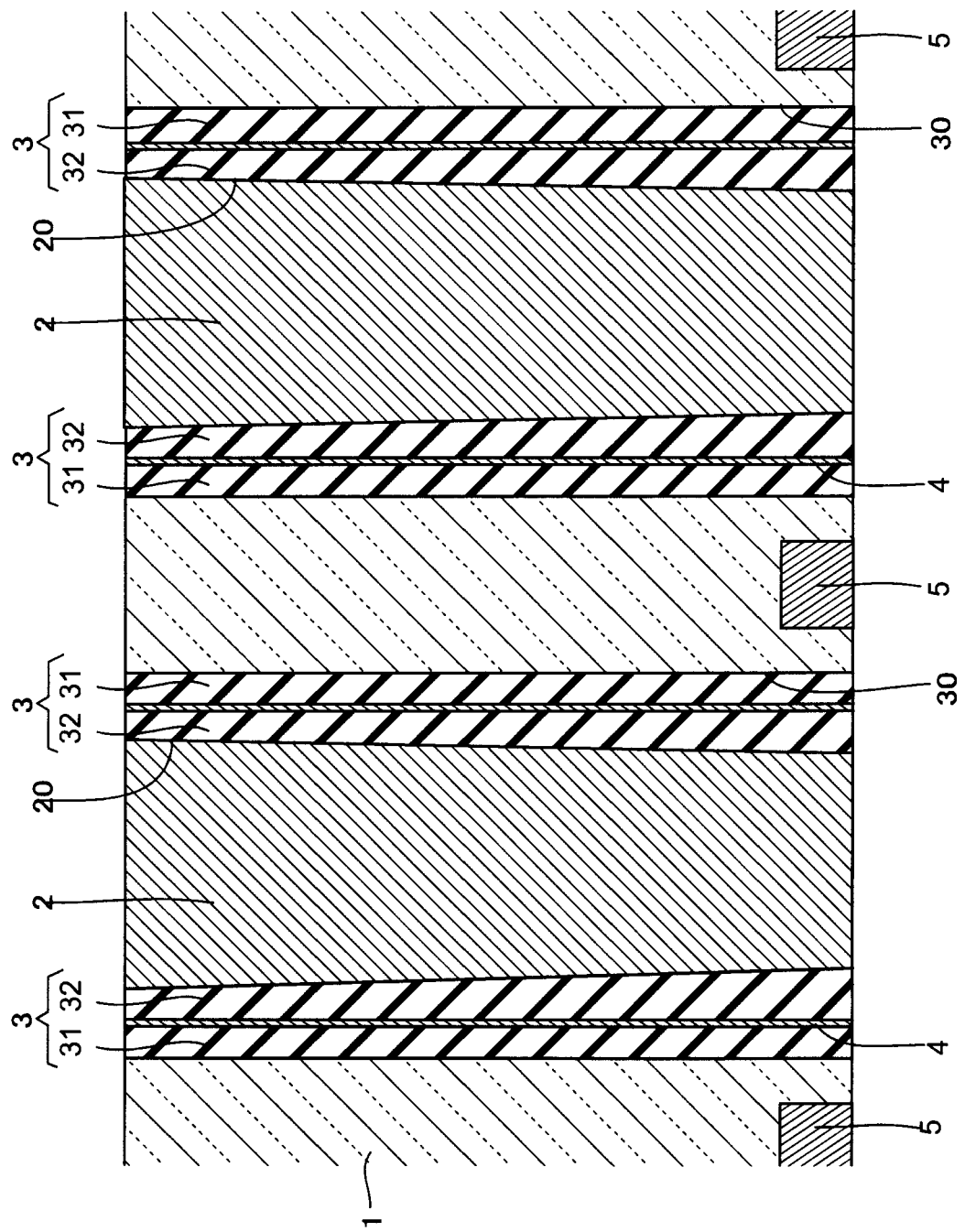
FIG. 3 is a sectional view showing a part of another embodiment of an electronic device according to the present invention.

The electronic device according to the present invention is not limited to the interposer shown in FIGS. 1 and 2 but can also be embodied with a circuit element 5 inside the semiconductor substrate 1. FIG. 3 shows one embodiment. In this figure, the portions corresponding to the components shown in FIGS. 1 and 2 are indicated by the same reference symbols and duplicate explanations are omitted.

In the semiconductor substrate 1 provided with the circuit element 5 such as an active element or a passive element, as shown in FIG. 3, an electromagnetic shielding layer 4 is embedded in the insulating material-filled layer 3 at a midpoint of a layer thickness thereof. The electromagnetic shielding layer 4 is ring-shaped to surround the vertical conductor 2. Since the electromagnetic shielding layer 4 is disposed at the midpoint of the insulating material-filled layer 3 as seen in the layer thickness direction, the insulating material-filled layer 3 is divided in two: an outside insulating layer 31 and an inside insulating layer 32.

In general, when electromagnetic waves pass through a conductive material, electromagnetic shielding can be explained as a phenomenon of providing attenuation of the electromagnetic waves because of its surface reflection and internal absorption. Metal materials generally known as a material for such a purpose can be used as a material for the electromagnetic shielding layer 4.

In the semiconductor substrate 1 provided with the circuit element 5 being an active element such as a semiconductor circuit or a passive element such as an antenna, the above electromagnetic shielding layer 4 can avoid characteristic change of the circuit element 5 due to electromagnetic field generated by high-frequency current passing through the vertical conductor 2.

Figure 4:
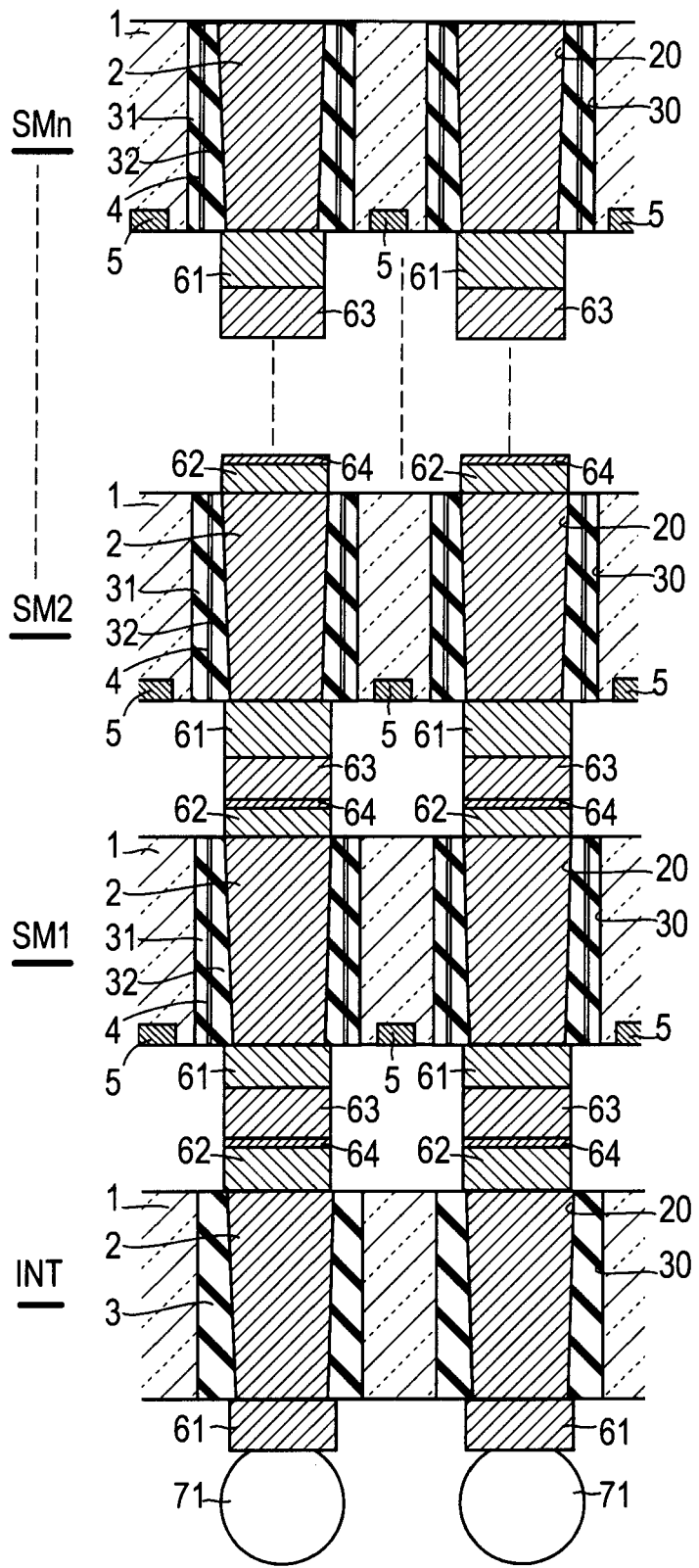
FIG. 4 is a sectional view showing an embodiment of an electronic device using a substrate according to the present invention.

Moreover, the electronic device according to the present invention can be embodied with a plurality of substrates stacked one on another. FIG. 4 shows one embodiment. In FIG. 4, the portions corresponding to the components shown in FIGS. 1 to 3 are indicated by the same reference symbols and duplicate explanations are omitted.

In the embodiment shown in FIG. 4, the structure is such that a plurality (n) of substrates SM1 to SMn shown in FIG. 3 are stacked one on another and joined together on a substrate INT shown in FIGS. 1 and 2. A metal ball 71 for connection to a mother board is joined to the vertical conductor 2 of the substrate INT.

Between adjacent ones of the substrates SM1 to SMn, for example, between the substrates SM1 and SM2, a connection conductor 61 located on the vertical conductor 2 of one substrate SM2 is connected to a connection conductor 62 located on the vertical conductor 2 of the other substrate SM1 through a junction film 63 and an antioxidizing film 64. The junction film 63 contains a first metal or alloy component and a second metal or alloy component having a higher melting point than the first metal or alloy component, whereby a melting temperature is made higher than the melting point of the first metal or alloy component.

The antioxidizing film 64 is comprised of a noble metal film and serves for flux-less joining. The noble metal film comprising the antioxidizing film 64 preferably contains at least one component selected from the group consisting of Ag, Au, Pd and Pt. In addition, the noble metal film preferably has a film thickness of 100 nm or less. Within this range, its inherent antioxidizing effect can be exhibited while suppressing increase of the film thickness with respect to an overall film thickness.

With the above composition of the junction film 63, when a heat treatment is performed for joining, the small size effect due to the small film thickness of the junction film 63 allows the second metal or alloy component to melt at a temperature close to the melting point of the first metal or alloy component. At this time, of course, the first metal or alloy component can also be melted. Then, since a low melting point metal of the first metal or alloy component is consumed by reacting with the connection conductor 4 and forming an intermetallic compound, the melting point increases considerably after joining.

In the electronic device being a finished product after solidification, moreover, since the melting temperature of the junction film 63 after solidification is mainly dominated by the melting point of the second metal or alloy component, the melting temperature of the junction film 63 increases to a temperature close to the melting point of the second metal or alloy component, i.e., a temperature that is higher than the melting point of the first metal or alloy component at the very least.

Therefore, it is possible to realize a highly heat-resisting electronic device which requires a low heat treatment temperature during the joining process but can secure a high melting point after solidification.

The first metal or alloy component preferably contains at least one component selected from the group consisting of Sn, In, Bi, Sb and Ga. On the other hand, the second metal or alloy component preferably contains at least one component selected from the group consisting of Cr, Cu, Ag, Au, Pt, Pd, Ni, a Ni—P alloy and a Ni—B alloy.

Typically, the electronic device according to the present invention can be embodied as a three-dimensional system-in-package (3D-SiP). More specifically, it may be a system LSI, a memory LSI, an image sensor, a MEMS or the like. It may also be an electronic device including an analog or digital circuit, a memory circuit such as DRAM, a logic circuit such as CPU or the like or an electronic device that is obtained by preparing different types of circuits such as an analog high frequency circuit and a low frequency, low power consumption circuit in different processes and stacking them.

Moreover, it includes most of electronic devices having an electronic circuit as a functional element, such as a sensor module, an optoelectronic module, a unipolar transistor, a MOS FET, a CMOS FET, a memory cell, integrated circuits (IC) thereof, or various scales of LSIs. It also includes a solar cell, a light-emitting diode, and an electronic device using the light-emitting diode, such as a light-emitting device, a lighting apparatus, a display, or a signal light.

Figure 5:
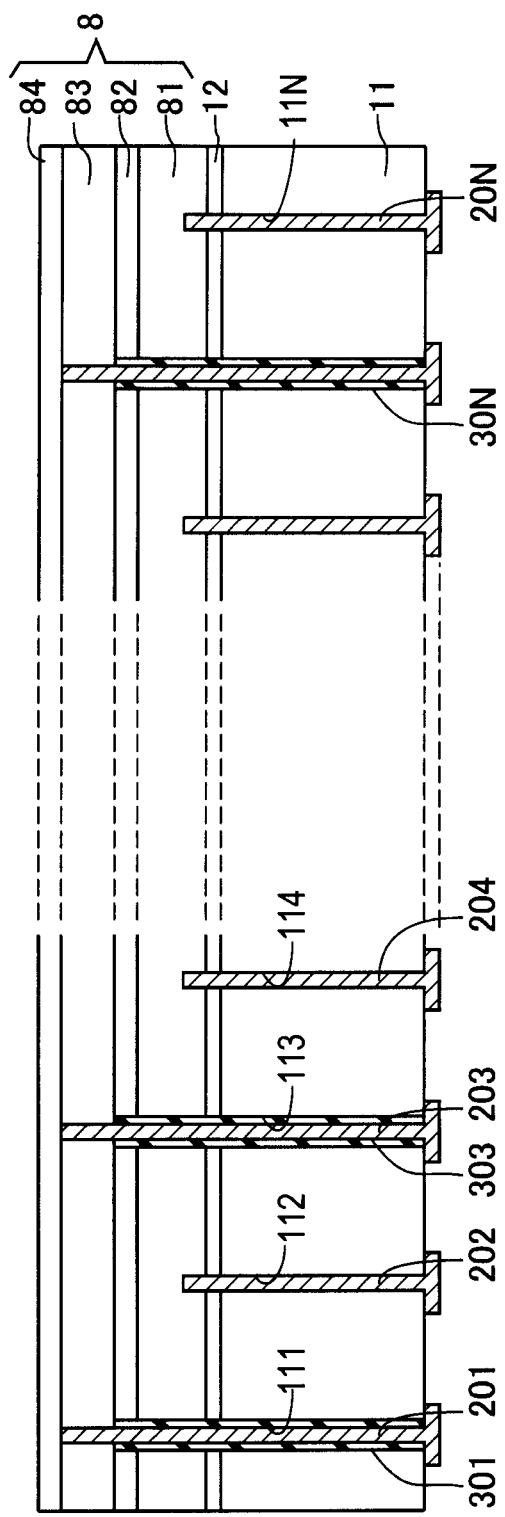
FIG. 5 is a sectional view showing another embodiment of an electronic device using a substrate according to the present invention.

FIG. 5 shows a light-emitting diode among the above-mentioned various electronic devices. Light-emitting diodes have the advantages of energy conservation and long service life and have come to attract attention as a light source of a light-emitting device, a color image display device, a backlight of a liquid crystal panel, or a traffic light.

The illustrated light-emitting diode includes a substrate 11, a semiconductor light-emitting layer 8, and electrodes (20$_1$ to 20$_N$). The semiconductor light-emitting layer 8 is deposited on one side of the substrate 11. The electrodes (20$_1$ to 20$_N$) are intended to supply an electrical energy to the semiconductor light-emitting layer 8 and comprise a conductive material filled in fine holes leading to the semiconductor light-emitting layer 8 through the substrate 11.

Typically, the substrate 11 is a sapphire substrate. A buffer layer 12 lies on one side of the substrate 11, and the semiconductor light-emitting layer 8 is disposed over the substrate 11 with the buffer layer 12 therebetween.

The semiconductor light-emitting layer 8 is well-known in the art of light-emitting diodes. It has pn junction and is typically made of a III-V group compound semiconductor. However, it is not limited to known technologies but can be made of any compound semiconductors that may be suggested in future. In the present invention, the light-emitting diode may be any one of red, green, blue and orange light-emitting diodes or a white light-emitting diode.

FIG. 5 shows an embodiment of a GaN-based blue light-emitting diode using a nitrogen (N)-based compound semiconductor. Referring to the figure, the semiconductor light-emitting layer 8 has a structure that an n-type semiconductor layer 81, an active layer 82, a p-type semiconductor layer 83, and a top layer 84 are stacked in the named order. For example, the n-type semiconductor layer 81 is comprised of a Si-doped GaN layer, while the p-type semiconductor layer 83 is comprised of a Mg-doped GaN layer.

The active layer 82 has a multiple quantum well (MQW) structure such as of GaN—InGaN and may have an Al—GaN superlattice cap layer on one side which is in contact with the p-type semiconductor layer 83. The top layer 84 is not required to be a transparent electrode layer as long as being an optically-transparent optical layer. That is, it is possible not to have any transparent electrode on the light-emitting surface of the semiconductor light-emitting layer 8.

The electrodes (201 to 20N) comprise a conductive material filled in fine holes (111 to 11N) leading to the semiconductor light-emitting layer 8 through the substrate 11.

Preferably, the fine holes (111 to 11N) are distributed with a given surface density. With this, the electrodes (201 to 20N) filled in the fine holes (111 to 11N) can serve as an alternative electrode to the conventional transparent electrode layer, facilitating the surface diffusion of current for the semiconductor light-emitting layer 8 to achieve uniform surface light emission. Thus, the transparent electrode layer can be omitted while improving the light emission amount and the light emission efficiency, whereby the fabrication process can be simplified for cost reduction. Moreover, the light energy loss due to the transparent electrode layer can be eliminated to improve the light emission amount and the light emission efficiency.

In the present embodiment, the fine holes (111 to 11N) are arranged in the form of matrix at a given pitch distance in the surface of the substrate 11. The number of rows and the number of columns are arbitrary. The fine holes (111 to 11N) have a hole diameter of the order of μm. The pitch distance may be of a similar order of magnitude.

Taking adjacent ones among the fine holes (111 to 11N), for example, the fine holes 111 and 112, the electrode 201 in one fine hole 111 serves as a p-side electrode, while the electrode 202 in the other fine hole 112 serves as an n-side electrode.

The electrode 201, which serves as a p-side electrode, penetrates through the substrate 11 and then through the buffer layer 12, the n-type semiconductor layer 81 and the active layer 82 to have its tip located within the p-type semiconductor layer 83. The electrode 201 is covered with an insulating material-filled layer 301 at an area that requires electrical insulation. The electrode 202, which serves as an n-side electrode, penetrates through the substrate 11 and the buffer layer 12 and terminates with its tip located within the n-type semiconductor layer 81.

The insulating material-filled layer 301 to 30N is a ring-shaped layer having an inorganic insulating material or an organic insulating material filled in the vertical hole 111 to 11N. Thus, a cylindrical area is formed in the insulating material-filled layer 301 to 30N. The vertical conductor 201 to 20N is filled in the cylindrical area surrounded by the insulating material-filled layer 301 to 30N.

As described above, the insulating material-filled layer 301 to 30N is the ring-shaped layer covering the inner periphery of the vertical hole 111 to 11N and the vertical conductor 201 to 20N is filled in the area surrounded by the insulating material-filled layer 301 to 30N, so that the vertical conductor 201 to 20N such as a through-electrode can be electrically insulated from another adjacent vertical conductor 201 to 20N different in polarity by the ring-shaped insulating material-filled layer 301 to 30N.

Moreover, since the insulating material-filled layer 301 to 30N comprises an inorganic insulating material or an organic insulating material filled in the vertical hole 111 to 11N and the vertical conductor 201 to 20N is a conductor filled in the area surrounded by the insulating material-filled layer 301 to 30N, both the vertical conductor 201 to 20N and the insulating material-filled layer 301 to 30N can be disposed within the vertical hole 111 to 11N unlike the conventional structure where the ring-shaped, insulating isolation groove is provided to surround the through-electrode in a spaced apart relationship. This reduces the area occupied by the vertical conductors 201 to 20N and the insulating material-filled layers 301 to 30N, thereby reducing the pitch distance between adjacent vertical conductors. As a result, the vertical conductors 201 to 20N can be distributed more densely to realize a high-performance, high-functionality light-emitting diode enabling uniform surface light emission.

The insulating material-filled layer 301 to 30N can be formed by filling a paste of an organic insulating material or a glass paste containing a nanocomposite ceramic into the vertical hole 111 to 11N and hardening it under pressure. That is, the insulating material-filled layer 301 to 30N can be formed by a simple and low-cost process of filling a paste material into the vertical hole 111 to 11N and hardening it.

Moreover, since the insulating material-filled layer 301 to 30N is a filled layer, there is no reason to narrow the groove width of the vertical hole 111 to 11N unlike the technique requiring a film deposition process. This facilitates the process of forming the insulating material-filled layer 301 to 30N.

Examples of the organic insulating material and inorganic insulating material for forming the insulating material-filled layer 301 to 30N are the same as described above. Here, the illustrated light-emitting diode can serve as a surface emitting type light-emitting device or color image display device by itself or can be used as a backlight of a liquid crystal display. It can also be used as a traffic light. Although not shown in the figures, a similar insulating structure can also be employed for a solar cell.

Figure 6:
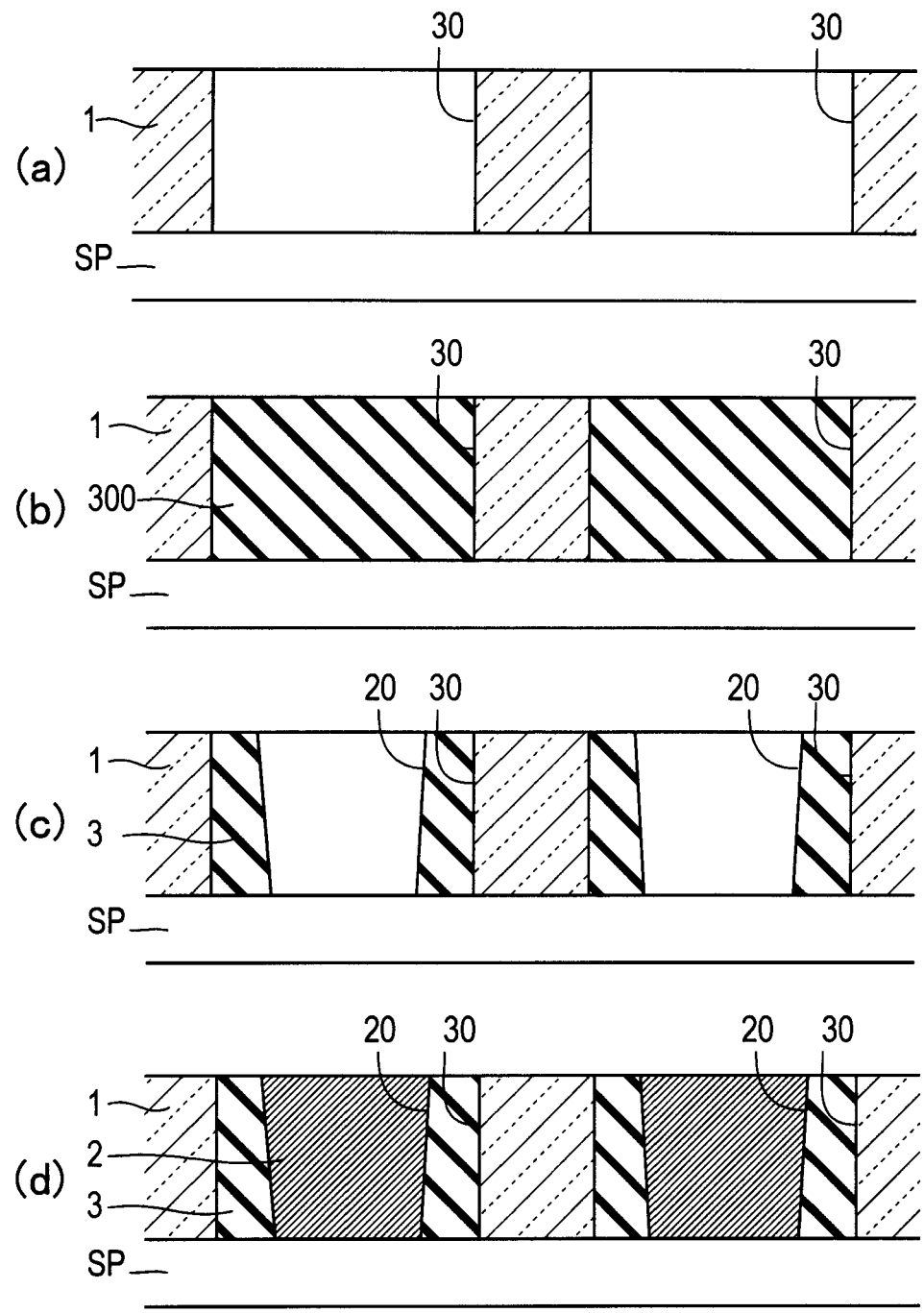
FIG. 6 is a diagram showing an electronic device manufacturing method according to the present invention.

Next, an electronic device manufacturing method according to the present invention will be described with reference to FIG. 6. As shown in FIG. 6(*a*), first, the semiconductor substrate 1 having the vertical holes 30 previously drilled is disposed on a support SP. The vertical holes 30 can be formed by a known technology such as dry-etching CVD or laser drilling.

Then, as shown in FIG. 6(*b*), an insulating material 300 is filled into the vertical hole 30. The filling may be performed such that an organic resin paste or a glass paste is poured into the vertical hole 30 under reduced-pressure atmosphere and the paste within the vertical hole 30 is then hardened while applying a pressure such as a pressing pressure, a gas pressure or a rolling pressure. The organic resin paste or the glass paste contains a nanocomposite ceramic.

Then, as shown in FIG. 6(*c*), the cylindrical area 20 is formed by applying a known drilling technology such as photolithography, dry-etching CVD or laser drilling to the insulating material 300 thus filled and hardened. Thus, the ring-shaped insulating material-filled layer 3 can be obtained. Which to choose among the above drilling technologies depends on the type of material used for the insulating material 300. In the case where the insulating material 300 is an ultraviolet curable resin, for example, photolithography can be adopted and the desired area 20 can be formed by performing exposure with ultraviolet rays and development.

Then, as shown in FIG. 6(*d*), the vertical conductor 2 is formed within the cylindrical area 20. The vertical conductor 2 may be formed such that a molten metal is poured into the cylindrical area 20 under reduced-pressure atmosphere and the molten metal within the cylindrical area 20 is then hardened while applying a pressure such as a pressing pressure, a gas pressure or a rolling pressure. Thus, the electronic device shown in FIGS. 1 and 2 can be obtained. The manufacturing method shown in FIG. 6 can also be applied to the manufacture of the light-emitting diode shown in FIG. 5 and a solar cell having a similar structure to the light-emitting diode.

Next, another electronic device manufacturing method will be described with reference to FIG. 7. As shown in FIG. 7(a), first, the semiconductor substrate 1 having the vertical holes 30 previously drilled is disposed on the support SP. The semiconductor substrate 1 also has the previously formed circuit elements 5 being an active element or a passive element.

Then, as shown in FIG. 7(b), the inorganic insulating material or the organic insulating material 300 is filled into the vertical hole 30 and then hardened.

Then, as shown in FIG. 7(c), a cylindrical area 21 is formed by performing the above drilling process on the insulating material 300 thus filled and hardened. Thus, a ring-shaped insulating material-filled layer 31 can be obtained. The cylindrical area 21 is defined by an inner wall surface 40 of the insulating material-filled layer 31.

Then, as shown in FIG. 7(d), the electromagnetic shielding layer 4 is formed on the inner wall surface 40 of the insulating material-filled layer 31. The electromagnetic shielding layer 4 can be formed by a vacuum deposition process such as sputtering. Inside the electromagnetic shielding layer 4 is formed a cylindrical area 22 defined by its inner wall surface.

Then, as shown in FIG. 8(a), an inorganic insulating material or an organic insulating material 301 is filled into the cylindrical area 22 surrounded by the electromagnetic shielding layer 4.

Then, as shown in FIG. 8(b), the cylindrical area 20 is formed by performing a drilling process on the insulating material 300 filled and hardened. Thus, a ring-shaped insulating material-filled layer 32 can be obtained.

Then, as shown in FIG. 8(c), the vertical conductor 2 is formed by filling a molten metal (or an alloy) for forming the vertical conductor into the cylindrical area 20 and hardening it. Thus, the electronic device shown in FIG. 3 can be obtained.

Figure 7:
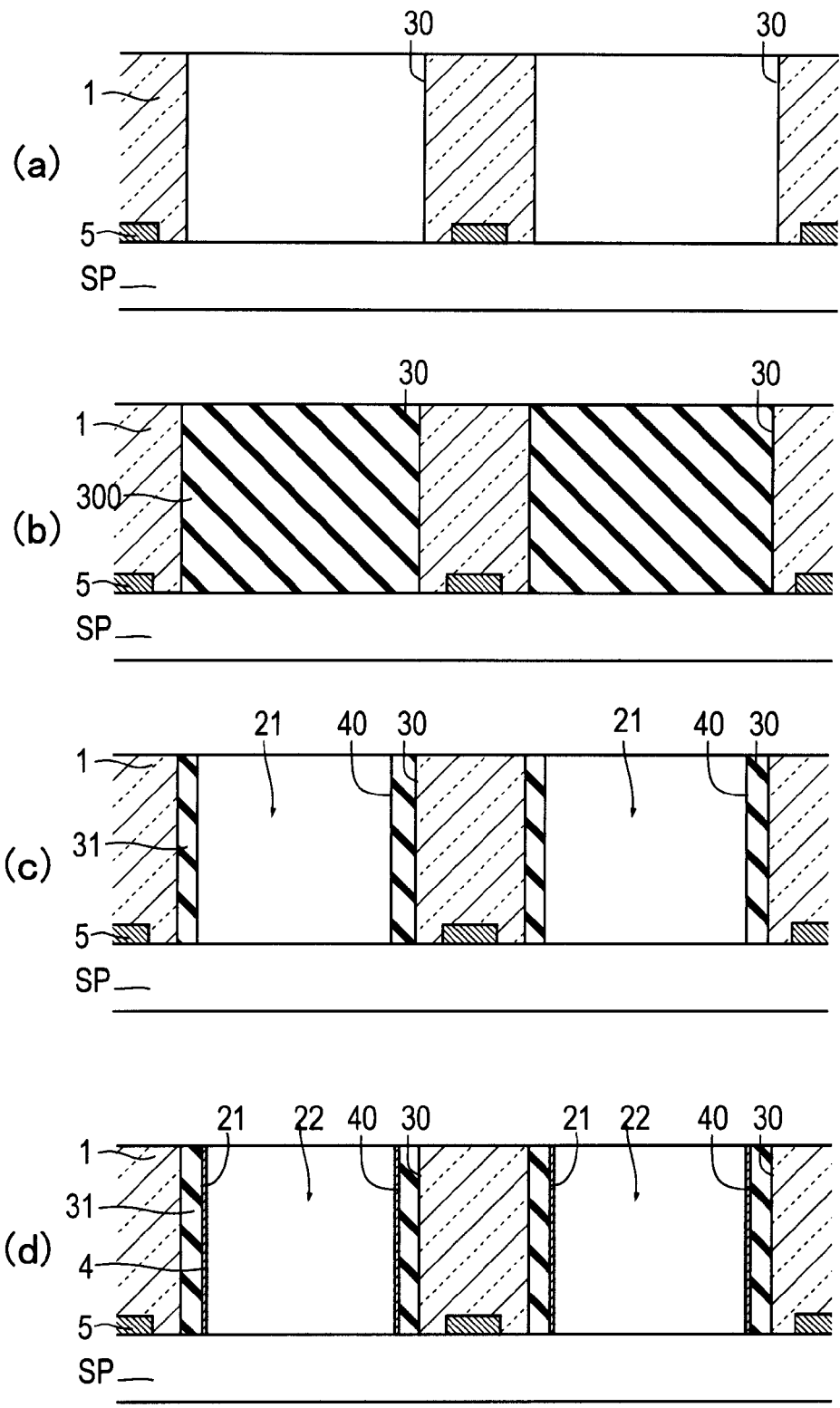
FIG. 7 is a diagram showing another electronic device manufacturing method according to the present invention.
Figure 8:
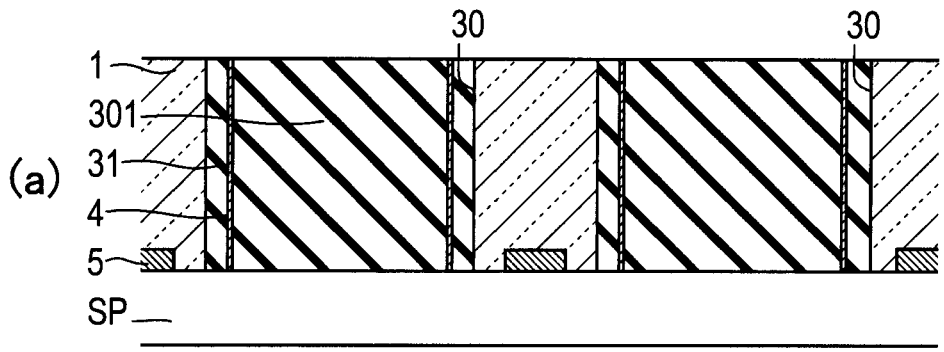
FIG. 8 is a diagram showing a process subsequent to the process shown in FIG. 7.
Figure 8:
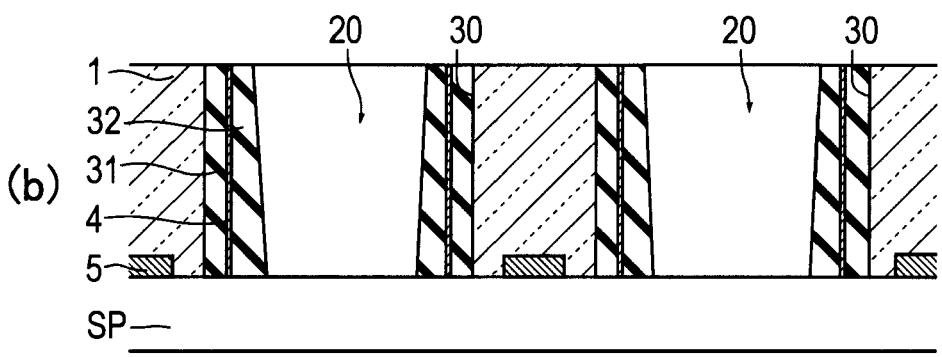
Figure 8:
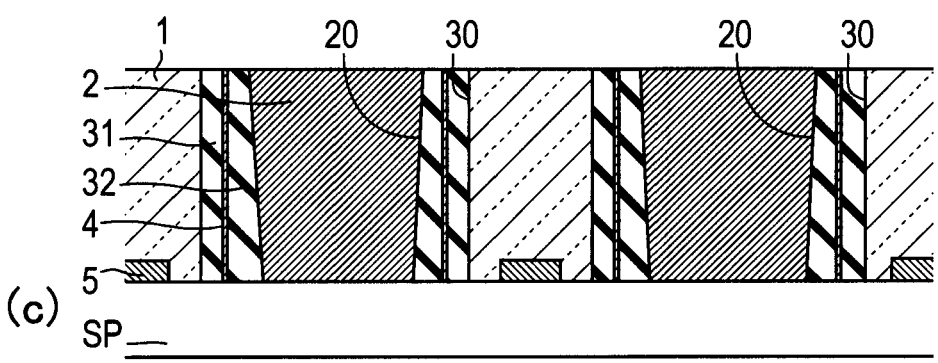

In the embodiment shown in FIGS. 7 and 8, the means for forming the vertical hole 30, the insulating material-filled layer 3, the electromagnetic shielding layer 4 and the vertical conductor 2 and materials thereof are the same as described above with reference to FIG. 4.

While the present invention has been particularly shown and described with respect to preferred embodiments thereof, it will be understood by those skilled in the art that various changes in form and detail may be made therein without departing from the spirit, scope and teaching of the invention.

What is claimed is:

1. An electronic device comprising a semiconductor substrate having a plurality of vertical conductors, each of the vertical conductors provided with an insulating material-filled layer in a vertical hole,
   the semiconductor substrate having the vertical hole extending in a thickness direction thereof,
   the insulating material-filled layer being a ring-shaped layer filled in the vertical hole for covering an inner periphery thereof, and the insulating material-filled layer substantially made from a liquid glass and a nanocomposite ceramic, the liquid glass containing at least one of $Na_2O$, $CaO$ and $K_2O$,
   the nanocomposite ceramic having a specific resistance of greater than $10^{14}$ Ω·cm at room temperature and a relative permittivity of 4 to 9, the nanocomposite ceramic suppressing leakage of high-frequency signal passing through the through hole,
   the vertical conductors being a solidified metal body filled in an area surrounded by the insulating material-filled layer,
   wherein the vertical conductors are aligned with each other at a pitch of 4 to 100 μm,
   wherein each of the vertical conductors is surrounded by the insulating material-filled layer inside the vertical hole,
   wherein the nanocomposite ceramic has a nanocomposite structure selected from the group consisting of: a structure where nanoparticles are dispersed in crystal grains of an element; or a structure where nanoparticles are dispersed in grain boundaries.

2. The electronic device of claim 1, further including an electromagnetic shielding layer embedded in the insulating material-filled layer at a midpoint of a layer thickness thereof to surround the vertical conductors.

3. The electronic device of claim 1, being a three-dimensional system-in-package (3D-SiP).

4. The electronic device of claim 1, comprising a light-emitting diode.

5. The electronic device of claim 1, wherein a maximum diameter D2 of the vertical conductor is in the range of 0.5 to 25 μm.

6. The electronic device of claim 1, wherein the insulating material-filled layer is formed by a process comprising:
   filling the paste in the vertical hole;
   solidifying the paste to form the solidified insulating material;
   drilling the area at a center of the solidified insulating material; and
   forming the vertical conductor inside the area.

* * * * *